(12) United States Patent
Arkiszewski

(10) Patent No.: US 7,082,177 B2
(45) Date of Patent: Jul. 25, 2006

(54) METHODS AND DEVICES FOR IMPROVING THE SWITCHING TIMES OF PLLS

(75) Inventor: Roman Z. Arkiszewski, Sinking Springs, PA (US)

(73) Assignee: Agere Systems Inc., Allentown, PA (US)

(*) Notice: Subject to any disclaimer, the term of this patent is extended or adjusted under 35 U.S.C. 154(b) by 943 days.

(21) Appl. No.: 09/994,847

(22) Filed: Nov. 28, 2001

(65) Prior Publication Data

US 2003/0099320 A1    May 29, 2003

(51) Int. Cl.
*H03D 3/24* (2006.01)

(52) U.S. Cl. .................... 375/376; 375/374; 375/375; 327/148; 327/157

(58) Field of Classification Search ............... 375/376, 375/375, 374; 327/147, 148, 156, 157; 331/1 A
See application file for complete search history.

(56) References Cited

U.S. PATENT DOCUMENTS

| 4,728,906 | A | * | 3/1988 | Turl et al. ................ 331/4 |
| 5,152,005 | A | * | 9/1992 | Bickley ................... 455/76 |
| 5,374,903 | A | * | 12/1994 | Blanton ................... 331/4 |
| 5,461,344 | A | * | 10/1995 | Andoh .................. 331/1 A |
| 5,821,789 | A | * | 10/1998 | Lee ........................ 327/156 |
| 6,509,806 | B1 | * | 1/2003 | Andrews .............. 331/117 R |

* cited by examiner

*Primary Examiner*—Temesghen Ghebretinsae

(57) ABSTRACT

The switching time of a phase-locked loop circuit is improved by switching a direct frequency control section, into and out of, the circuit.

9 Claims, 1 Drawing Sheet

METHODS AND DEVICES FOR IMPROVING THE SWITCHING TIMES OF PLLS

BACKGROUND OF THE INVENTION

In the near future new third generation (3G) mobile telephony standards, such as CDMA2000 and W-CDMA (Wideband Code Division Multiple Access) will be introduced. To keep pace, systems and devices need to be re-designed. For example, these new standards will require faster phase-locked loop (hereafter referred to as "PLL") circuits.

Re-designing a PLL means modifying its operational characteristics. Three common operating characteristics are phase noise, reference frequency spurious suppression and settling time. (i.e., switching speed). Existing attempts to modify PLLs have focused on simultaneously improving all three operating characteristics. Unfortunately, when one characteristic is improved it has adverse affects on another. For example, improving a PLL's switching speed or settling time has adverse affects on its phase noise and reference spurious suppression.

As new, mobile terminals (e.g., wireless telephones, PDAs, etc . . . ) are deployed to meet new standards, there will be a need to provide backward compatibility with existing standards. So-called dual-band/dual-mode or tri-band/triple-mode terminals are becoming common, and will continue to proliferate. These terminals must operate using both existing (so-called second generation or "2G") and 3G standards. The base stations which communicate with these mobile terminals have identical multi-band, multi-mode requirements. To do so PLLs present in both mobile terminals and fixed base stations must be capable of operating over a wide frequency range. Said another way, such a PLL must adjust or "re-tune" the frequency at which it is operating. The time it takes for a PLL to re-tune, however, is limited by its "loop filter bandwidth" (often also optimized for noise and spurious performance) and the maximum current available from a "charge pump" output.

Additionally, PLLs used in dual or triple band terminals or base stations may have to be re-tuned to a frequency within a given frequency band, and/or to a frequency within an entirely different band. This type of re-tuning may be several hundred megahertz (MHz) in nature and would be slowed down by phase ambiguities in the phase/frequency detector ("PFD").

Accordingly, it is desirable to provide for devices and methods which improve a PLL's switching speed without sacrificing other operating characteristics of the PLL.

Other desires will become apparent from the drawings, detailed description of the invention and claims, which follow.

SUMMARY OF THE INVENTION

In accordance with the present invention, the switching time of a PLL circuit is improved by switching a direct frequency control section into, and out of, the circuit.

The present invention envisions a PLL, which may be made as one or more integrated circuits, comprising a direct frequency control section adapted to provide a coarse adjustment to a control voltage associated with a voltage controlled oscillator. The direct frequency control section is connected/disconnected to a frequency generation/ synthesis section which provides conventional fine-tuning adjustments. The coarse tuning capability allows the PLL to reduce the time it takes for it to switch from one frequency of operation to another.

DETAILED DESCRIPTION OF THE INVENTION

The present invention provides for a fast switching PLL without sacrificing other important PLL operating characteristics.

Figure 1:
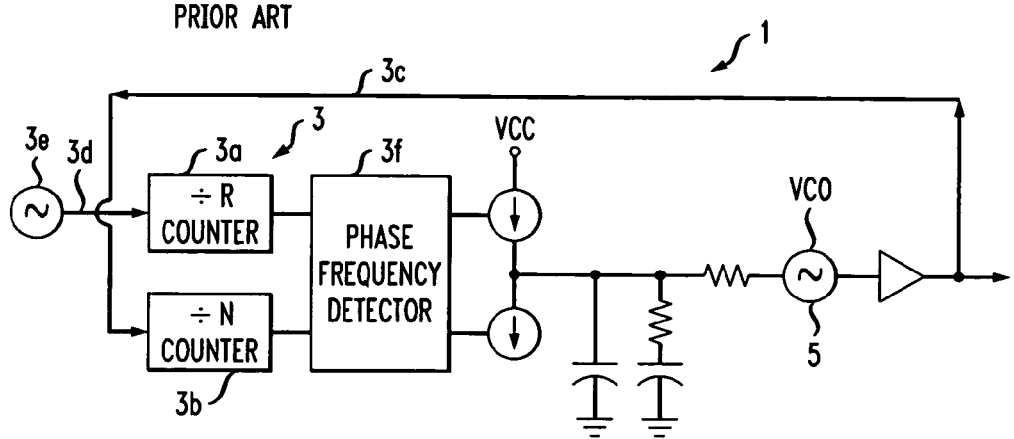
FIG. 1 depicts an example of a conventional PLL.

Referring to FIG. 1, there is shown a conventional PLL 1, the detailed operation of which is known in the art and will not be repeated here. Suffice it to say that many PLLs, including the one shown in FIG. 1, comprise a voltage controlled oscillator ("VCO") 5. VCOs are used to generate signals which operate over a range of frequencies. The VCO's 5 frequency of operation at any given moment is controlled by a "control voltage". Typically, the control voltage is generated as follows. First, frequency counters (e.g., dividers and/or multipliers 3a,3b) are adapted to compare two frequencies; one from VCO 5 via pathway 3c and the second from a precise frequency reference 3e via pathway 3d. The two frequencies are compared using a PFD 3f, which in turn generates the control voltage which "closes and locks" a PLL "loop".

Figure 2:
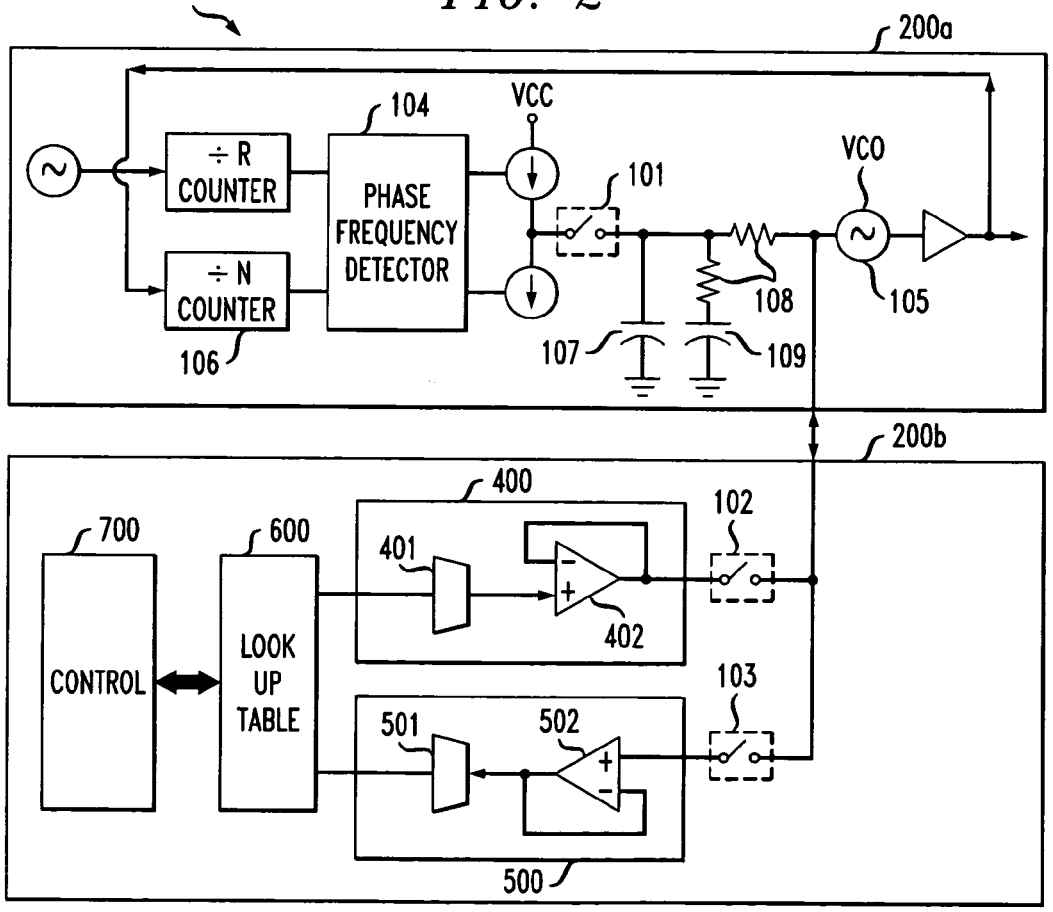
FIG. 2 depicts a fast switching PLL according to one embodiment of the present invention.

Referring now to FIG. 2 there is shown a PLL 100 according to one embodiment of the present invention. For ease of understanding, FIG. 2 shows PLL 100 comprising a frequency generation/synthesis section 200a (for "fine tuning") (hereafter referred to as "frequency synthesis" section) and a direct frequency control section 200b (for "coarse tuning"). Comparing conventional PLL 1 shown in FIG. 1 with PLL 100 shown in FIG. 2, it can be seen that a switch 101 and section 200b have been added.

The PLL 100 may comprise a single integrated circuit ("IC") or two or more ICs (e.g., the frequency generation components of section 200a are placed on one IC or module, while the frequency synthesis components of section 200a and the direct frequency control section 200b are placed on a second) which in turn may be made apart of a mobile terminal or base station. The operation of PLL 100 will now be described in more detail.

In an illustrative embodiment of the present invention, section 200b comprises a first tuning section 400, second tuning section 500, look-up-table 600, control section 700 and switches 102,103 for connecting/disconnecting section 200b to/from section 200a. The first tuning section 400 comprises a digital-to-analog converter ("DAC") 401 and first operational amplifier (referred to as an "op-amp") 402. It should be understood that one or more of the elements of section 200b may be placed on the same IC or each of the elements may be placed on separate ICs. That said, for cost and space reasons, it may be more desirable to use a single IC. It is to be further understood that the control section 700 may or may not be a part of section 200b.

Sections 200a and 200b may be adapted to operate as follows. Upon sensing that the output of VCO 105 needs to be re-tuned to a new frequency a microcontroller (which may comprise unit 700 or another microcontroller (not shown)), sends instructions to divide-by-N counter 106 to reprogram it. The microcontroller also sends instructions to switch 101 and switch 102 causing them to connect/disconnect components of PLL 100. Upon receiving these instructions, switches 101 and 102 are adapted to open and close, respectively. When so positioned switches 101,102, first tuning section 400 and look-up table 600 are thereafter adapted to re-tune (i.e., adjust the control voltage) of VCO 105. This provides a fast "coarse" adjustment to the control voltage and therefore, to the frequency of operation of VCO 105. This coarse adjustment is substantially within the range of a newly desired operating frequency. This completely bypasses the loop filter (i.e., capacitor 107, resistors 108 and capacitor 109), which would ordinarily be used to generate a DC control voltage, as well as PFD 104 and charge pump output. Following this, switches 101 and 102 are adapted to revert to their original state upon receiving instructions from a microcontroller or the like (again, either unit 700 or another microcontroller). The PLL 100 may thereafter be adapted to further adjust the control voltage or enter a frequency/phase lock mode while maintaining the frequency stability of the VCO 105 (i.e., "fine tune", or revert to "normal" operation).

The role of the look-up table 600 in re-tuning VCO 105 will now be described in more detail. Look-up-table 600 is adapted to store data which represents a plurality of tuning voltages. Each voltage in turn corresponds to a frequency. At substantially the same time as switch 101 is opened and switch 102 is closed, control section 700 instructs the look-up-table 600 to output a signal representative of a specific tuning voltage to the first tuning section 400. More precisely, the look-up-table 600 is adapted to output such a signal to the DAC 401 which converts the signal from a digital signal to an analog signal so it can be used by op-amp 402 to produce an amplified and/or appropriately scaled voltage signal which is then fed to VCO 105. Upon receiving this control voltage signal, the VCO 105 is adapted to adjust its operating (i.e., output) frequency.

When the control section 700 determines that coarse tuning has been completed and that the VCO 105 has reached a desired frequency, the control section 700 is further adapted to instruct the switch 101 to close and switch 102 to open. This permits normal PLL operation, (i.e., fine-tuning). This "fine tune" adjustment locks the PLL loop which stablizes the PLL's operating frequency until a new frequency is desired by the microcontroller, at which time the whole process repeats itself. It should be understood that the VCO 105 needs to maintain a precise operating frequency in order maintain a "locked" mode, hence the name, "phased-locked loop".

This process of outputting a signal representing a specific tuning voltage to perform coarse tuning may be repeated for a range of tuning voltages/frequencies.

The look-up-table 600 can also be adapted to receive information about the initial operating frequencies being output by the VCO 105 upon initial power-up of the PLL 100. This information is used to provide the look-up-table 600 with precise, in-circuit output frequencies of the VCO 105. From these frequencies will come a range of tuning frequencies or voltages. One method of providing the look-up-table 600 with the initial frequencies is as follows.

In one embodiment of the present invention, control section 700 (or another microcontroller) is adapted to instruct switches 101 and 103 to close while switch 102 remains open. Thereafter, the control section 700 instructs the PLL 100 to tune to a plurality of frequencies. The "steady-state" control voltage associated with each frequency is sensed by the second tuning section 500. The second tuning section 500 comprises an analog-to-digital converter ("ADC") 501 and a second op-amp 502. The combination of the second op-amp 502 and ADC 501 is adapted to sense a voltage representative of each of the output frequencies of the VCO 105 and to convert them to digital signals which are then sent on to look-up-table 600. Thereafter, the look-up-table 600 is adapted to store data representative of these signals (i.e., representative of the various output frequencies of the VCO 105). The stored signals are used by the look-up-table 600 to generate a frequency versus voltage response reference or calibration table or the like. It is this calibration table that is stored within the look-up-table 600 and which is used by the look-up-table 600 to adjust the VCO 105 in combination with the first tuning section 400.

It should be further understood that each of the sensed voltages may be compared to some reference range. Taken together these steps provide circuits, like circuit 100, with a "built-in-self-test" (BIST) capability. This capability reduces manufacturing costs, especially when PLL/VCO systems are manufactured in large quantities. Additionally, this capability reduces maintenance costs because such self diagnostics allows a faulty unit in the field (e.g., faulty module in a mobile terminal or faulty board in a base station) to be pin-pointed.

The calibration table, along with the first and second tuning sections 400,500, can be further used to reduce the effects caused by variations in control voltage versus output frequency responses found in the manufacture of multiple VCO/PLL systems. For example, conventional VCO/PLL component tolerance issues can lead to poor manufacturing yields (i.e., added costs), or the need to trim, adjust or align the products ( . . . also adds cost . . . ). In an alternative embodiment of the invention, a correction factor can be applied (e.g., by a microcontroller) to the look-up table 600. This factor would correct for the mismatch between the PFD/charge pump output voltage range and the VCO control voltage range. In one example of this embodiment of the invention, the look-up table 600 and first tuning section 400 are adapted to provide a "second" control voltage via switch 102, substantially at the same time that the frequency generation/synthesis section 200*a* is providing a "first" control voltage through switch 101 ( . . . which occurs during normal operation or fine tuning). The second control voltage acts as an in-circuit automatic "alignment". This improves manufacturing yield and eliminates the need to perform costly manual adjustments.

In effect, the present invention envisions switching section 200*b* into, and out of, section 200*a* to allow for coarse tuning, among other things. By switching the section 200*b* into and out of section 200*a* the switching time of PLL 100 is improved (e.g., decreased). This improvement is done to: (1) bypass the loop filter, which normally is critical in determining switching time, noise and spurious performance, while tuning over a wide frequency range; this means that PLLs envisioned by the present invention comprise loop filters which provide noise and spurious suppression without incurring delay during large frequency re-tuning; and (2) bypass normal PLL dynamics related to large frequency re-tuning (i.e., phase ambiguities/cycle slips when the PFD phase error is greater than 360 degrees) because the entire section 200*b*, first "learns" the frequency vs. control voltage response of the VCO 105 (via sections 500 and 600) and then provides a "coarse tune" (via sections 600 and 400). Thus, when the PLL resumes normal operation the time needed to fine tune and lock the PLL is greatly reduced.

The above discussion has attempted to provide some examples of the features and functions of a fast switching PLL. It should be understood that variations may be made to the examples above without departing from the spirit and scope of the present invention as defined by the claims which follow.

We claim:

1. A phase-locked loop (PLL) circuit comprising:
   (a) a frequency synthesis section comprising;
      (1) a voltage-controlled oscillator (VCO) adapted to generate a PLL output signal for the PLL circuit based on a control voltage signal applied at an input of the VCO;
      (2) a loop filter connected to the VCO input;
      (3) a phase frequency detector (PFD) adapted to compare a feedback signal derived from the PLL output signal to a reference signal;
      (4) a charge pump adapted to generate charge based on output signals from the PFD; and
      (5) a first switch adapted to selectively connect the charge pump to the loop filter;
   (b) a direct frequency control section comprising:
      (1) a look-up table (LUT) adapted to store digital data values representing a plurality of tuning voltages corresponding to different frequencies for the PLL output signal;
      (2) a first tuning section adapted to convert a digital data value received from the LUT into a corresponding tuning voltage for the VCO;
      (3) a second switch adapted to selectively connect the first tuning section to the VCO input to selectively apply the corresponding tuning voltage from the first tuning section as the control voltage signal for the VCO;
      (4) a second tuning section adapted to generate a digital data value for the LUT corresponding to the control voltage signal applied to the VCO input; and
      (5) a third switch adapted to selectively connect the VCO input to the second tuning section to selectively enable the second tuning section to update the LUT based on the generated digital data value; and
   (c) a controller adapted to control the first, second, and third switches.

2. The invention of claim 1, wherein the first tuning section comprises:
   a digital-to-analog converter (DAC) adapted to convert the digital data value received from the LUT into an analog signal; and
   a first operational amplifier (op-amp) adapted to generate the corresponding tuning voltage from the analog signal.

3. The invention of claim 2, wherein the second tuning section comprises:
   a second op-amp adapted to sense the control voltage signal applied to the VCO input;
   an analog-to-digital converter (ADC) adapted to convert the sensed control voltage signal from the second op-amp into the corresponding digital data value for the LUT.

4. The invention of claim 1, wherein the second tuning section comprises:
   a second op-amp adapted to sense the control voltage signal applied to the VCQ input;
   an ADC adapted to convert the sensed control voltage signal from the second op-amp into the corresponding digital data value for the LUT.

5. The invention of claim 1, wherein the controller is adapted to control operations of the PLL in first, second, and third modes such that:

in the first mode, the first switch is closed and the second and third switches are open, such that the frequency synthesis section generates the control voltage signal for the VCO;

in the second mode, the second switch is closed and the first and third switches are open, such that the direct frequency control section generates the control voltage signal for the VCO; and in the third mode, the first and third switches are closed and the second switch is open, such that the frequency synthesis section generates the control voltage signal for the VCO, while the direct frequency control section updates the LUT.

6. The invention of claim 5, wherein the controller is adapted to:
   transition from the first mode to the second mode when the frequency of the PLL output signal is to be changed from a current frequency to a different, desired frequency; and
   transition from the second mode back to the first mode after the controller determines that the PLL output signal has sufficiently achieved the desired frequency.

7. The invention of claim 5, wherein, when the PLL is in the third mode, the controller is adapted to sequentially select a plurality of different frequencies for the PLL output signal to generate a plurality of different digital data values for the LUT.

8. The invention of claim 5, wherein the controller is further adapted to control operations of the PLL in a fourth mode, wherein the first and second switches are closed and the third switch is open, such that the frequency synthesis generates a first portion of the control voltage signal for the VCO, while the direct frequency control section generates a second portion of the control voltage signal for the VCO.

9. The invention of claim 8, wherein:
   the first tuning section comprises:
      (i) a digital-to-analog converter (DAC) adapted to convert the digital data value received from the LUT into an analog signal; and
      (ii) a first operational amplifier (op-amp) adapted to generate the corresponding tuning voltage from the analog signal; and
   the second tuning section comprises:
      (i) a second op-amp adapted to sense the control voltage signal applied to the VCO input;
      (ii) an analog-to-digital converter (ADC) adapted to convert the sensed control voltage signal from the second op-amp into the corresponding digital data value for the LUT;
   the controller is adapted to:
      (i) transition from the first mode to the second mode when the frequency of the PLL output signal is to be changed from a current frequency to a different, desired frequency; and
      (ii) transition from the second mode back to the first mode after the controller determines that the PLL output signal has sufficiently achieved the desired frequency; and
   when the PLL is in the third mode, the controller is adapted to sequentially select a plurality of different frequencies for the PLL output signal to generate a plurality of different digital data values for the LUT.

* * * * *

UNITED STATES PATENT AND TRADEMARK OFFICE
CERTIFICATE OF CORRECTION

| | | |
|---|---|---|
| PATENT NO. | : 7,082,177 B2 | Page 1 of 1 |
| APPLICATION NO. | : 09/994847 | |
| DATED | : July 25, 2006 | |
| INVENTOR(S) | : Roman Z. Arkiszewski | |

It is certified that error appears in the above-identified patent and that said Letters Patent is hereby corrected as shown below:

In column 5, line 61, replace "VCQ" with --VCO--.

Signed and Sealed this

Seventh Day of November, 2006

JON W. DUDAS
*Director of the United States Patent and Trademark Office*